United States Patent [19]
DeHaven et al.

[11] Patent Number: 5,171,642
[45] Date of Patent: * Dec. 15, 1992

[54] MULTILAYERED INTERMETALLIC CONNECTION FOR SEMICONDUCTOR DEVICES

[75] Inventors: Patrick W. DeHaven; J. Daniel Mis; Kenneth P. Rodbell; Paul A. Totta, all of Poughkeepsie; James F. White, Newburgh, all of N.Y.

[73] Assignee: International Business Machines Corporation, Armonk, N.Y.

[*] Notice: The portion of the term of this patent subsequent to Dec. 10, 2008 has been disclaimed.

[21] Appl. No.: 638,888

[22] Filed: Jan. 8, 1991

Related U.S. Application Data

[63] Continuation-in-part of Ser. No. 339,533, Apr. 17, 1989, Pat. No. 5,071,214.

[51] Int. Cl.$^5$ .................. B32B 15/20; C23C 14/16; C23C 14/34
[52] U.S. Cl. .................. 428/620; 428/651; 204/192.17; 427/123; 257/750
[58] Field of Search .............. 428/651, 660, 661, 620, 428/610; 357/71; 204/192.15, 192.17; 427/250, 255.7, 405, 123, 124

[56] References Cited

U.S. PATENT DOCUMENTS

| | | | |
|---|---|---|---|
| 4,017,890 | 4/1977 | Howard et al. | 357/67 |
| 4,612,257 | 9/1986 | Broadbent | 428/620 |
| 4,673,623 | 6/1987 | Gardner et al. | 428/620 |

FOREIGN PATENT DOCUMENTS 0307272  3/1989  European Pat. Off. .

OTHER PUBLICATIONS

IBM Technical Disclosure Bulletin, vol. 21, No. 11, Apr. 1979, "Sputtered Metallurgy Process for Electromigration Improvement of Al-Cu" by P. S. Ho et al, pp. 4527-4528.
IBM Technical Disclosure Bulletin, vol. 27, No. 1A, Jun. 1984, "Elimination of Microblisters in Aluminum Metallurgy Systems Employing A Cr-Cr203 Underlying Layer", by J. J. Gajda et al., p. 343.
IBM Technical Disclosure Bulletin, vol. 21, No. 2, Jul. 1978 "Thin Film Metallurgy with Sandwich Barrier Layer", by A. Brouillard et al., p. 576.
IEEE V-MiConf., Jun. 25-26, 1985 "Homogeneous and Layered Films of Aluminum/Silicon with Titanium for Multilevel Interconnects" by D. S. Gardner et al., pp. 102-113.
MRS Symposia Proceedings, Fall, 1987, "Multilayered Interconnections for VLSI" by D. S. Gardner et al, pp. (1 of 12 through 12 of 12).
Electrical Society Extended Abstracts, vol. 84-2, Fall 1984, "Corrosion Behavior of Al-Cu Alloy Thin Films in Microelectronics" by J. Zahavi, M. Rotel, H. C. W. Hwang and P. A. Totta.
IBM Technical Disclosure Bulletin, vol. 13, No. 5, Oct. 1970, by J. J. Gniewek et al. "Titanium Overlay on Metallurgy" p. 1124.
J. Appl. Phys. 49(7), Jul. 1978, "Intermetallic Compounds of Al and Transitions Metals: Effect of Electromigration in 1-2-$\mu$M-Wide Lines", pp. 4083-4093.

*Primary Examiner*—John Zimmerman
*Attorney, Agent, or Firm*—Jeffrey L. Brandt; Harold Huberfeld

[57] ABSTRACT

A low copper concentration multilayered, device interconnect metallurgy, comprises an aluminum-copper (<2 weight percent copper) conductor having formed on one of its surfaces a layer of an intermetallic compound formed from a Group IVA metal and aluminum from the aluminum-copper conductor. The intermetallic compound is formed so as to contain only the single phase line compound of the intermetallic compound.

9 Claims, 4 Drawing Sheets

MULTILAYERED INTERMETALLIC CONNECTION FOR SEMICONDUCTOR DEVICES

This application is a continuation-in-part of U.S. application Ser. No. 07/339,533 filed Apr. 17, 1989, now U.S. Pat. No. 5,071,214.

BACKGROUND OF THE INVENTION

1. Field of the Invention

This invention relates to metallization for the interconnection of semiconductor devices on a substrate and more particularly to such metallization which includes a low percent copper content aluminum/copper conductor.

2. Description of Related Art

Thin narrow interconnections have been used for some years for device interconnection purposes in the semiconductor integrated circuit industry. It is predicted that performance of these devices in the future will be limited by the performance of the device interconnection at the submicron level. At the submicron level, various technical problems are known to occur. While aluminum has been the preferred interconnection metal, as device dimensions are scaled down and current density increases, pure aluminum has been known to be susceptible to the problems of electromigration and hillock growth. To overcome the problems experienced with pure aluminum, aluminum has been alloyed with copper to form aluminum-copper. However, high percentage aluminum-copper (>2%) is known to be difficult to dry etch and corrodes easily.

In an effort to improve on the use of aluminum-copper as the interconnection metallurgy, aluminum-copper has been taught to be layered with a refractory metal (i.e., U.S. Pat. No. 4,017,890). This patent teaches a method and resulting structure for forming narrow intermetallic stripes which carry high currents on bodies such as semiconductors, integrated circuits, etc., wherein the conductive stripe includes aluminum or aluminum-copper with at least one transition metal. While the aluminum-copper and transition metal structure has been known to improve the electromigration problems associated with aluminum-copper, the problems of etching and corrosion, as well as, the complete elimination of hillocks have not been solved.

As known in the art, hillocks are known to result from the large differences between the thermal expansion coefficients of the metal interconnect lines and the substrate creating compressive stresses in the metal. To eliminate and minimize hillock formation, it has been known in the art to use a multilayered structure instead of a single layer of the interconnect metallurgy. An effective reduction in hillock formation has been found to be achieved by using a multilayered structure of aluminum or aluminum intermetallic with a layer of refractory metal. Wherefore, a typical interconnect metallurgy structure would comprise a layered structure of aluminum silicon compound onto which there has been deposited, a layer of refractory metal, such as, titanium (see article "Homogeneous and Layered Films of Aluminum/Silicon with Titanium For Multilevel Interconnects", 1988 IEEE, V-MIC Conference, Jun. 25-26, 1985).

There have also been refinements to this layered metal structure to provide a lower resistivity, hillock free, interconnect metallurgy. These refinements include the incorporation of a barrier metal of, for example, titanium tungsten or titanium nitride under the aluminum silicon to prevent contact spiking and prevent the formation of ternary compounds in the aluminum silicon alloy (see article "Multilayerd Interconnections For VLSI" MRS Symposia Proceedings, Fall, 1987).

In addition, in this area, there have also been other proposed device interconnect structures to reduce resistivity and provide a more planar and defect free interconnect structure.

For example, IBM Technical Disclosure Bulletin, Vol. 21, No. 11, April, 1979, pp. 4527-4528, teaches the enhancement of the metallurgy for the interconnection due to sputtered deposition. Moreover, the feature of using a capping layer to improve performance has been proposed in IBM TDB Vol. 17, No. 1A, 1984 and TDB Vol. 21, No. 2, July 1978. However, no structure has been discovered which can satisfy all performance criteria providing a low resistance, hillock free, corrosion resistant, etchable, interconnection metallurgy structure.

It is, therefore, an object of the present invention to provide low weight percent copper (<2%) content aluminum/copper conductor for device interconnection on a substrate with superior electromigration characteristics.

It is a still further object of the present invention to develop a multilayered interconnect metallurgy structure that is hillock free, dry etchable and corrosion resistant.

It is another object of the present invention to provide a multilayered interconnect metallurgy structure which has a low resistivity.

SUMMARY OF THE INVENTION

A low-copper concentration, multilayered, device interconnect metallurgy structure is disclosed herein. The interconnect metallization structure comprises aluminum-copper (<2 weight percent copper) and an intermetallic of a group IV A metal and aluminum from said aluminum-copper. The intermetallic is formed to contain the single phase line compound obtained, for example, by sputter-depositing or evaporating (at an ultra-high vacuum) the aluminum-copper.

DESCRIPTION OF THE PREFERRED EMBODIMENTS

Figure 1:
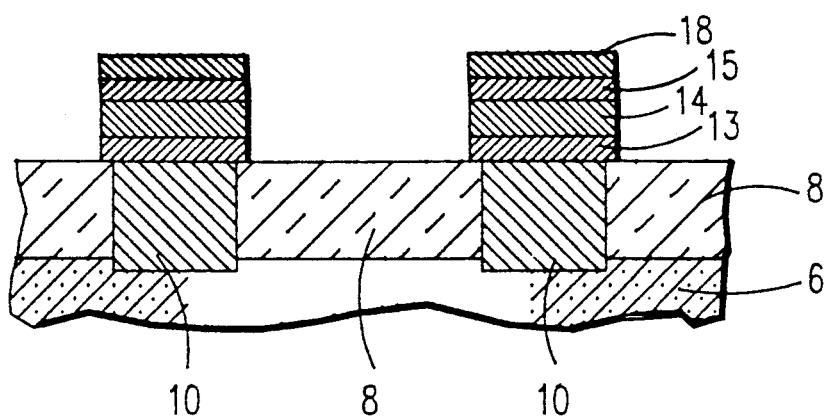
FIG. 1 is a cross-sectional view of the preferred embodiment of an interconnect metallurgy according to the subject invention.

FIG. 1 is a cross-sectional view of the preferred embodiment of an interconnect metallurgy structure according to the subject invention. FIG. 1 represents the interconnect structure after being processed through final annealing.

Referring to FIG. 1, the interconnect metallurgy is seen to comprise a four-layer structure over an interplanar stud connection 10 surrounded by an insulator 8 to make connection to a device substrate 6. The four-layer structure consists of a bottom-layer 13 of an intermetallic formed by the reaction between the conductor layer 14 and pre-annealed surface layer 12 (see FIGS. 2-7). The layer 13 is typically 700Å thick and in a preferred embodiment would comprise TiAl₃. Onto said intermetallic layer 13 is formed a sputter-deposited, low percent (<2) weight percent copper, aluminum-copper, conductor layer 14. After annealing, the layer 14 is typically 8,500Å thick and consists of a composition of 99.5% aluminum and 0.5% copper (aluminum-0.5% copper hereafter). On layer 14 is a second intermetallic layer 15 of the same thickness and composition as the layer 13. A layer 18 of aluminum-0.5% copper or pure aluminum of approximately 100Å to 500Å thick is then deposited to cap the structure. While this completes the structure for a single interconnect layer according to the subject invention, it should be recognized by those skilled in the art that said layers can then be repeated in a multiple level sequence to complete the interconnect circuit for the devices.

Figure 2:
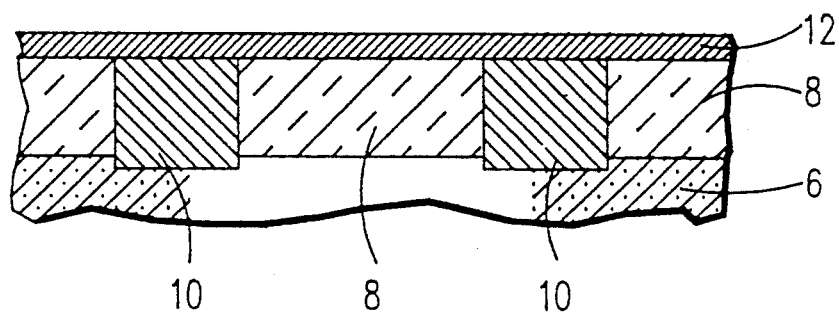
FIGS. 2 through 8 are cross-sectional views of the process for building the preferred interconnect metallurgy of the subject invention in a step-by-step fashion.

Referring now to FIG. 2, FIG. 2 shows a planar insulator 8 and contact stud 10 with a Group IVA metal layer 12 deposited thereon, for example by sputtering or chemical vapor deposition (CVD).

This first level metallization 12 is comprised of a Group IVA metal, preferably titanium, deposited on the device contact metallization 10 of the wafer in a blanket formation.

Figure 3:
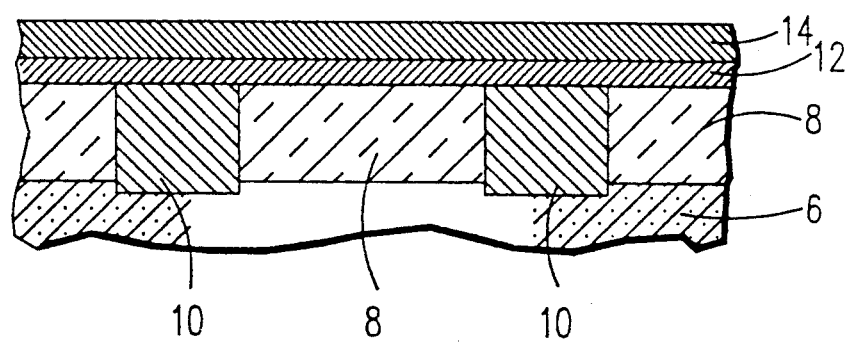

Referring now to FIG. 3, following the deposition of the layer 12, the interconnect metallization layer 14 is next blanket deposited. The interconnect metallization 14 is preferably aluminum-0.5% copper (approximately 9,500Å thick). The aluminum-copper is deposited at high power using a direct current magnetron in a high purity argon plasma from an ultra-pure pre-alloyed target typically aluminum-0.5 weight percent copper with a deposition rate of about 1,500Å per minute.

Figure 4:
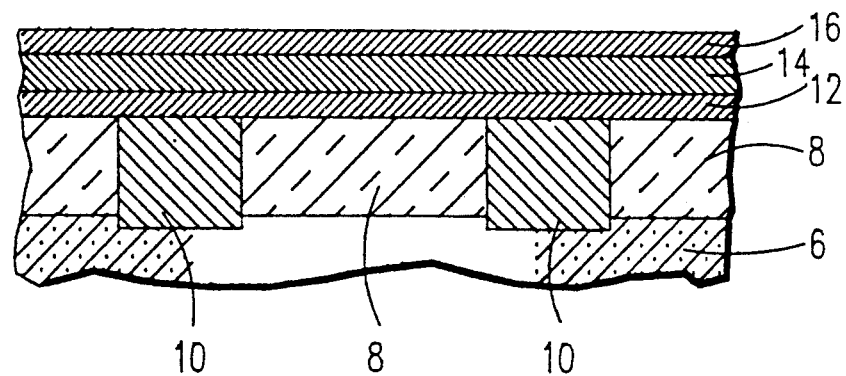

Onto said aluminum-copper interconnect metallization 14 is then deposited 250Å of a Group IVA metal similar to the previously deposited metal layer 12 discussed above. Deposition, composition and thickness of said layer 16 is identical to the previously deposited layer 12 (FIG. 4).

Figure 5:
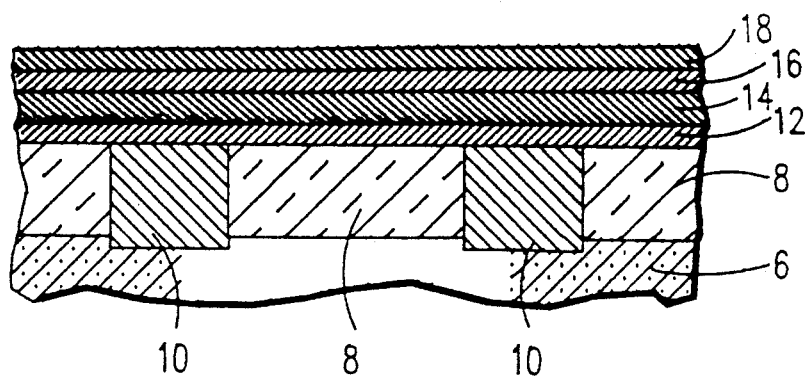

From FIG. 5, onto said metal layer 16 is then blanket deposited a suitable capping layer 18 to complete the interconnect metallurgy at this level. The capping layer 18 is preferably comprised of aluminum-0.5% copper deposited in the same manner as the conductor aluminum-0.5% copper layer 14 as discussed above. The purpose of this layer is to: 1) prevent over-etch of metal layer 16; 2) limit the amount of light reflection during the subsequent photoresist steps, and 3) to act as a protective layer against corrosion during subsequent processing. Therefore, any layer which would similarly satisfy the requirements of reducing the amount of light reflection and provide protective anodic capping during subsequent processing would be usable for this layer (e.g. pure aluminum).

Figure 6:
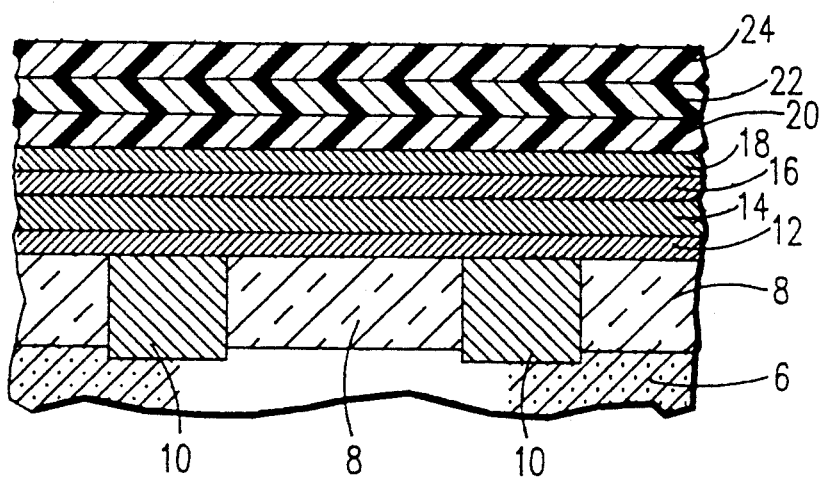
Figure 7:
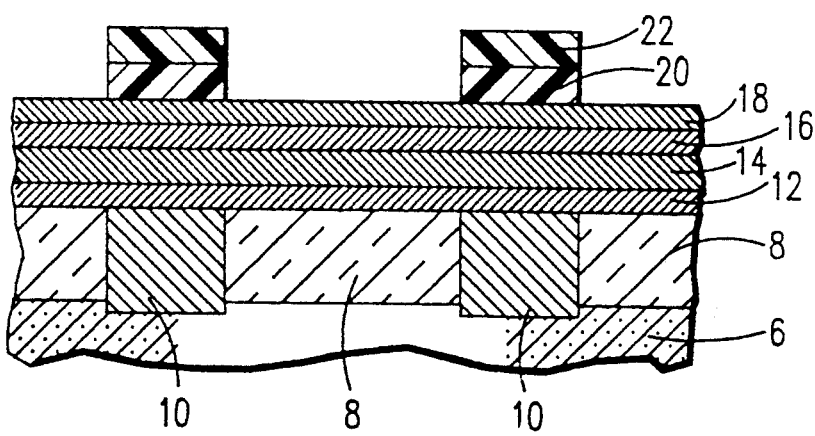

Referring now to FIG. 6, on top of metallization 18, a multilayered photoresist (20, 22 and 24) is then applied to pattern this blanket interconnect metallization. Any number of different photoresist techniques can be used. In particular, multilayered photoresists are well suited for this purpose, as well as, single-layered resists.

With a multilayered resist as shown in FIG. 6, a first resist 20 is applied to a thickness of approximately 1.8 micrometers. In the preferred embodiment this resist is a diazo-quinone novolak photoresist. The resist 20 is baked in an oven in a nitrogen ambient at about 200° C. for 30 minutes. This resist 20 serves as a sacrificial layer during subsequent metal reactive ion etching (RIE).

Onto said resist 20 is then deposited 200Å of an oxygen-resistant agent 22, such as, HMDS (hexamethyldisilizane). The HMDS 22 serves as a barrier to the oxygen reactive ion etching which is used to pattern the imaging layer resist 24.

Onto said HMDS layer 22 is next deposited an imaging layer resist 24 to a thickness of about 0.9-1.2 micrometers. Similar to resist 20, imaging resist 24 is a diazo-quinone novolak positive photoresist. The HMDS 22 and imaging resist layer 24 are then baked on a hot plate for 25 minutes at 85° C.

The imaging layer resist 24 is then exposed for the specific time required when used in conjunction with a specific exposure tool and associated mask. The exposed image is developed using conventional developing for the required time depending on the exposure. The wafer is then rinsed and dried and the patterned top imaging layer is UV hardened by exposing it to ultraviolet light for a specific period of time, typically, 5 to 10 minutes.

Following the patterning of the top imaging resist 24, the HMDS 22 and resist layer 20 are ready to be removed to expose the metal. The HMDS 22 and the resist 20 are selectively removed by reactive ion etching. This is accomplished by loading the wafer into a plasma tool and exposing the wafer to a plasma reactive to the HMDS layer 22 (e.g. CF₄) and then to a different plasma (e.g. O₂) reactive to resist 20. The polymer residues of the remains of the HMDS layer 22 and the resist 20 are then removed by dipping in a solution of a conventional cleaning etch solution. This reactive ion etching of the HMDS layer 22 and the resist 20, has put a lithographic mask into place (FIG. 7) for the subsequent reactive ion etching of the underlying blanket metal layers.

The metallurgy can now be reactively ion etched in a multi-step sequence. The first step is to break through any oxides which may exist on the top surface of the metallization. Next, most of the metal is removed by reactive ion etching. An over etch is, then, performed to insure that all of the metal in the previous step has been etched away. Finally, a passivation step is performed to prevent any metal corrosion.

The reactive ion etch is typically performed in a single wafer tool under a low pressure. Typical plasma composition, pressure, power and time combinations, for performing the above etches in a step-by-step process can be seen from the following Table I. These compositions, pressures, powers and times should be recognized by those skilled in the art as being designed for a specific tool under specific conditions. Any comparable times, compositions, pressure, etc., could be similarly fabricated to insure the etch of the blanket metallization.

TABLE I

| | Gas Flow (cc/min) | | | |
|---|---|---|---|---|
| | Step 1 | Step 2 | Step 3 | Exit |
| BCl₃ | 20 | 12 | 12 | — |
| Cl₂ | 11 | 11 | 8 | — |
| CHCl₃ | 5 | 16 | 16 | — |

TABLE I-continued

| | Gas Flow (cc/min) | | | |
|---|---|---|---|---|
| | Step 1 | Step 2 | Step 3 | Exit |
| N$_2$ | 50 | 50 | 50 | — |
| CF$_4$ | — | — | — | 180 |
| O$_2$ | — | — | — | 20 |
| Pressure (milli-Torr) | 375 | 375 | 375 | 0.5 Torr |
| Power (Watts) | 485 | 350 | 350 | 130 |
| Typical Times | 15 sec | 2–3 min | 40 sec | 20 sec |

With the completion of the reactive ion etch, the wafer can then be rinsed and dried.

The reactive ion etch of the metal removes any of the remaining imaging layer resist 24 and most of the the HMDS layer 22 leaving on the surface of the metal the resist 20. This resist 20 can be removed by placing the wafer in an oxygen plasma for approximately 45 minutes The wafer is then placed in a developer at room temperature for a short period of time to remove any oxides that may have formed in the previous step. The wafer is again rinsed and dried.

Figure 8:
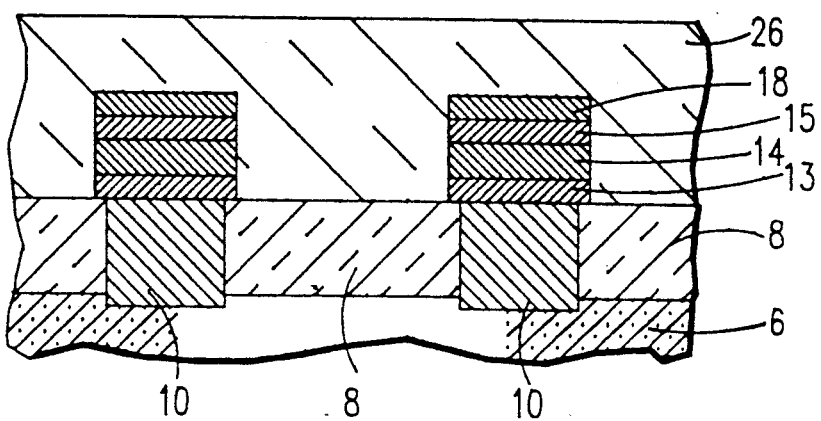

With removal of this final layer of the resist 20, the metallization stack can now be annealed by placing the wafer in an oven at 400° C. in forming gas for 1 hour in order to form TiAl$_3$ intermetallic layers 13 and 15 (as shown in FIGS. 1 and 8) on the top and the bottom of the aluminum-copper layer 14 and to allow grain growth to occur in the aluminum-copper layer 14.

From FIG. 8, it can be seen that once the metallization stack has been annealed (to the structure of FIG. 1) a suitable insulator 26 (e.g., planar quartz or plasma-enhanced CVD oxide or an organic insulator such as polyimide) can be blanket deposited over the multilayered interconnect structure. This insulator 26 can then be planarized and/or patterned for stud connection to the repeating interconnect layers deposited onto the base interconnect layer.

Figure 9:
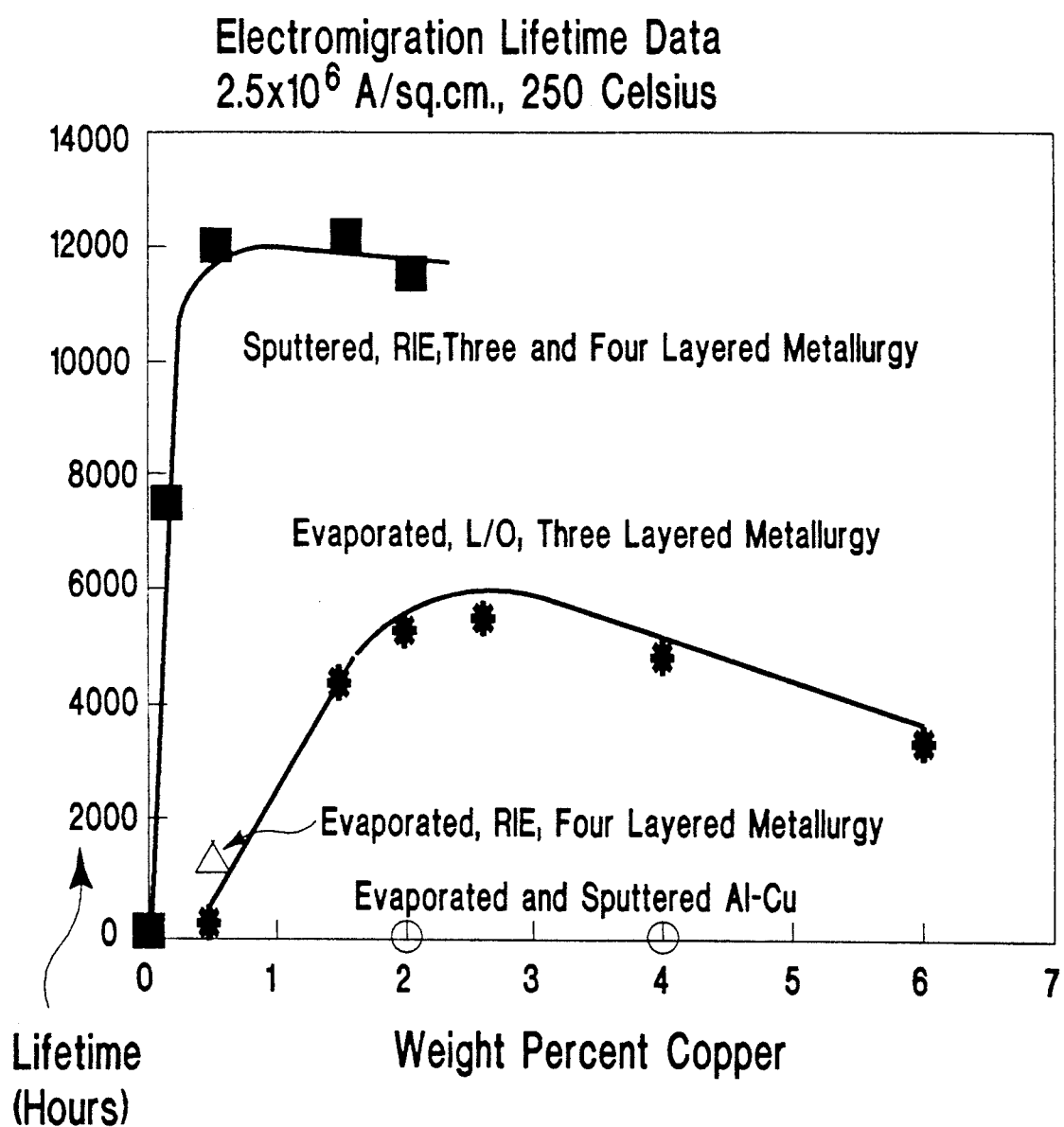
FIG. 9 is a graph of the lifetime (hours) versus weight percent copper for interconnect metallurgies of the subject invention as compared to prior art interconnect metallizations.

The superior performance of the interconnect metallurgy of the subject invention over that which is known in the prior art can be seen in the following figures. FIG. 9 is a lifetime (hours) versus weight percent copper graph for the electromigration characteristics of both the above-described sputtered four-layered structure and an alternative sputtered three-layer structure (Al/Cu/refractory metal/Al-Cu), as compared to an evaporated three-layer structure patterned by lift-off and an evaporated four-layer structure, patterned by RIE. From FIG. 9 it can be seen that for all weight percent copper compositions, the sputtered interconnect metallurgies are vastly superior to the evaporated metallurgies.

Figure 10:
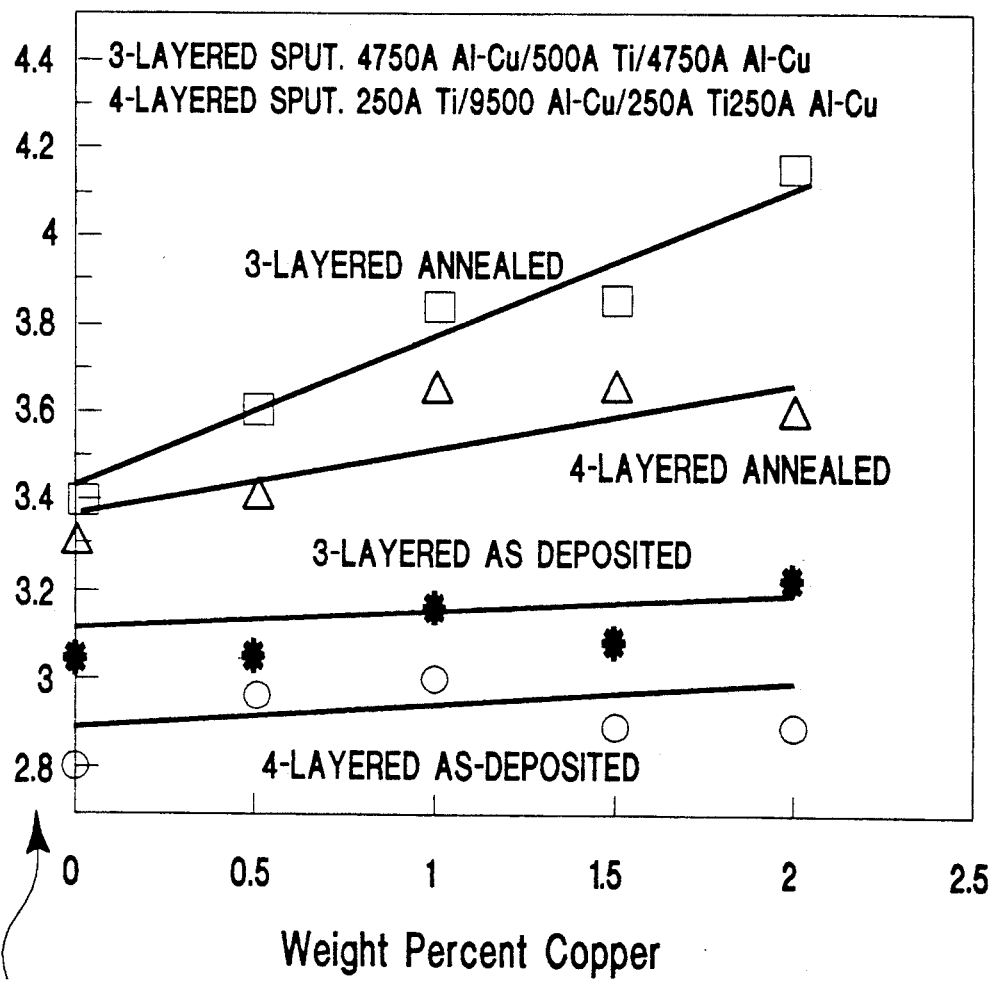
FIG. 10 is a graph of the resistivity versus weight percent copper for various alternative embodiment metallurgies of the subject invention before and after anneal.

FIG. 10 is a graph of the resistivity versus weight percent copper for various alternative embodiment metallurgies of the subject invention. The metallurgies have been subjected to a 400° C. forming gas anneal wherein the plots have been taken both before and after said anneal. From the plots it can clearly be seen that the resistivity of the 0.5 weight percent copper structures are lower than that of the higher weight percent copper films. Additionally, it can also be seen that the annealed films of the four-layer structure have a lower resistivity than the annealed films of the three-layer structure.

The following Table II is a further comparison of the electromigration characteristics of sputtered Al-0.5% Cu metallurgy after annealing with intermetallic formation as compared to various other interconnect metallurgies.

TABLE II

| ALLOY | RESISTIVITY ($\mu\Omega$ - cm) 1hr. 400C Forming Gas | T(50%) 250C,2.5E + 06A/cm$^2$ (Hours) |
|---|---|---|
| Al-0.5%Cu (Ref. #1) | 3.5 | 9000 |
| Al-0.5%Cu (Ref. #2) | 3.4 | 12000 |
| Evap (Ref. #3) | 3.7 | 400–500 |
| Evap (Ref. #4) | 3.8 | 400–500 |
| Cr/Al-4%Cu | 3.0 | 400 |
| Al | 2.8 | 15 |
| Al-0.5%Cu | 2.9 | 50 |
| Al-1.2%Si-0.15%Ti | 3.1 | 23 |
| Al-1.2%Si (Ref. #5) | 2.9 | 156* |
| Al-1%Ti | 6.6 | 2 |
| Al-Si/Ti (Ref. #6) | 3.1 | 300* |

*150C, 1E + 06 A/cm$^2$, unpassivated
1. Sputtered 4250A Al-0.5%Cu/1500A TiAl$_3$/4250A Al-0.5%Cu (after annealing in forming gas at 400° C. for 1 hr.).
2. Sputtered 700A TiAl$_3$/8500A Al-0.5%Cu/700A TiAl$_3$/250A Al-0.5%Cu (after annealing in forming gas at 400° C. for 1 hr).
3. Evaporated 4250A Al-0.5%Cu/1500A TiAl$_3$/4250A Al-0.5%Cu (after annealing in forming gas at 400° C. for 1 hr.).
4. Evaporated 700A TiAl$_3$/8500A Al-0.5%Cu/700A TiAl$_3$/250A Al-0.5%Cu (after annealing in forming gas at 400° C. for 1 hr.).
5. F. Fisher, Siemens Forsch-U. Entwickl-Dec. 13, 21 (1984).
6. D S. Gardner, T. L. Michalka, P. A. Flinn, T. W. Barbee Jr., K. C. Saraswat & J. D. Meindl, Proc. 2nd IEEE VMIC, pp. 102–113 (1985).

From the table it can be seen that the sputtered 0.5% copper metallurgy provides the longest electromigration capability with the lowest resistivity.

In general, while the corrosion resistance of bulk aluminum is greatly decreased by the addition of copper, it is known and recognized in the art (see, for example, J. Zahavi, M. Rotel, H. C. W. Huang, P. A. Totta, "Corrosion behavior of Al-Cu Alloy Thin Films in Microelectronics," Electrical Society Extended Abstracts, Vol. 84-2, Fall, 1984.) that the corrosion resistance of reactive ion etched low copper containing films of aluminum (e.g., preferably less than or about 0.5% copper) are at least as good as bulk aluminum. This suggests that the degradation of corrosion resistance becomes significant only when the Cu concentration is above 2%.

While hereinabove the aluminum-copper layers 14, 18 have been described as being sputter-deposited, the present inventors have determined that such sputter deposition, while comprising one method of practicing the invention, is not the only method of practicing the invention.

The present inventors have discovered that the benefits of the present invention are obtained whenever the intermetallic layer (i.e. the intermetallic formed by the Group IVA metal and aluminum from the low copper content aluminum-copper layer) is comprised only of the single phase line compound of the intermetallic, and no second or higher-order phases. For example, when Ti is used as the Group IVA metal, the benefits of the present invention are obtained when the composition of the intermetallic is TiAl$_3$. Metallurgy containing the phase Ti$_9$Al$_{23}$, higher order phases, or mixed single and higher order phases, do not show the benefits of the present invention.

Experimentation has shown that not only can the desired intermetallic structure be obtained by sputter depositing the low copper content aluminum-copper layer in the manner described above, but it can also be obtained by the evaporation formation of the same low copper content aluminum-copper layer at ultra high vacuums, i.e. in the range of $3 \times 10^{-9}$ Torr. (It will be understood that those evaporated samples shown hereabove in Table II did not utilize this high vacuum process nor obtain only the single phase line compound and the resulting benefits described here.)

With the present inventors having explained the desired end-structure including the intermetallic layer containing only the single phase line compound, other processes for obtaining such a structure will be apparent to those skilled in the art.

The present inventors have thus provided a metallurgy comprised of an aluminum-copper layer (less than 2.0% copper by weight) and an intermetallic layer (formed from a Group IVA metal and aluminum from said aluminum-copper layer) which is highly resistant to electromigration while also being readily etchable in comparison to the high-copper content compounds taught in the prior art. The metallurgy of the present invention is formed in a manner so as to obtain the single phase line compound, but none of the higher order phases, of the intermetallic compound. This is accomplished, for example and without limitation, by sputter-depositing the aluminum-copper layer in a conventional manner, or evaporating the layer under an ultra-high vacuum.

The present invention is particularly well suited for the formation of very thin, narrow lines of the type used to interconnect semiconductor devices on a semiconductor substrate. The invention thus has particular use in the formation of integrated circuit devices, and particularly in the formation of very large scale integrated circuits (VLSIC).

While the invention has been particularly shown and described with reference to the preferred embodiments thereof, it will be understood by those skilled in the art that the foregoing and other changes is form and details may be made therein without departing from the spirit and scope of the invention.

What is claimed is:

1. A metallization structure for the interconnection of semiconductor devices on a substrate comprising:
    a layer of sputter deposited aluminum-copper of greater than 0.0% and less than 2.0% copper by weight; and
    an intermetallic layer formed at the surface of said aluminum-copper layer, said intermetallic formed of a Group IVA metal and aluminum of said aluminum-copper layer;
    said intermetallic layer containing the single phase line compound of said intermetallic and no second or higher phases of said intermetallic.

2. A metallization structure according to claim 1 wherein said intermetallic layer is formed over both sides of said aluminum-copper layer.

3. A method of forming a structure for connecting semiconductor devices on a substrate comprising the steps of:
    sputter depositing a layer of aluminum-copper of greater than 0.0% and less than 2.0% copper by weight onto said substrate; and
    forming a layer of a Group IVA metal on said aluminum-copper layer so as to form an intermetallic layer of the Group IVA metal and aluminum from said aluminum-copper layer;
    said sputter depositing and forming steps performed such that said intermetallic layer contains the single phase line compound of said intermetallic and no second or higher phases of said intermetallic.

4. A metallization substrate for connecting semiconductor devices on a substrate comprising:
    a layer of aluminum-copper of greater than 0.0% and less than 2.0% copper by weight; and
    an intermetallic layer formed at the surface of said aluminum-copper layer comprising a Group IVA metal and aluminum of said aluminum-copper layer;
    said intermetallic layer containing the single phase line compound of said intermetallic and no second or higher phases of said intermetallic.

5. The metallization structure of claim 4 wherein said layer of aluminum-copper is formed by the process of sputtering.

6. The metallization structure of claim 4 wherein said layer of aluminum-copper is formed by the process of evaporation.

7. A method of forming a metallization structure for connecting semiconductor devices on a substrate comprising the steps of:
    forming a layer of aluminum-copper of greater than 0.0% and less than 2.0% copper by weight; and
    forming an intermetallic layer at the surface of said aluminum-copper layer comprising a Group IVA metal and aluminum of said aluminum-copper layer;
    said intermetallic layer formed so as to contain the single phase line compound of said intermetallic and no second or higher phases of said intermetallic.

8. The metallization structure of claim 7 wherein said layer of aluminum-copper is formed by the process of sputtering.

9. The metallization structure of claim 7 wherein said layer of aluminum-copper is formed by the process of evaporation.

* * * * *